(12) United States Patent
Hu et al.

(10) Patent No.: US 8,525,299 B2
(45) Date of Patent: Sep. 3, 2013

(54) ELECTRICAL OVERSTRESS PROTECTION USING THROUGH-SILICON-VIA (TSV)

(71) Applicants: Lejun Hu, Somerville, MA (US); Srivatsan Parthasarathy, Burlington, MA (US); Michael Coln, Lexington, MA (US); Javier Salcedo, North Billerica, MA (US)

(72) Inventors: Lejun Hu, Somerville, MA (US); Srivatsan Parthasarathy, Burlington, MA (US); Michael Coln, Lexington, MA (US); Javier Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/786,646

(22) Filed: Mar. 6, 2013

(65) Prior Publication Data

US 2013/0175669 A1 Jul. 11, 2013

Related U.S. Application Data

(62) Division of application No. 13/297,571, filed on Nov. 16, 2011, now Pat. No. 8,441,104.

(51) Int. Cl.
*H01L 27/02* (2006.01)

(52) U.S. Cl.
USPC ............ 257/546; 257/173; 257/328; 257/355

(58) Field of Classification Search
USPC .......... 257/443, 173, 328, 355, 546, E29.015, 257/E23.194, E21.361
See application file for complete search history.

(56) References Cited

U.S. PATENT DOCUMENTS

| | | | |
|---|---|---|---|
| 5,371,351 A | 12/1994 | Van Berkel | |
| 6,593,597 B2 | 7/2003 | Sheu | |
| 7,064,353 B2 | 6/2006 | Bhat | |
| 7,544,947 B2 | 6/2009 | Kerwin et al. | |
| 7,791,159 B2 * | 9/2010 | Kuriyama | 257/443 |
| 7,810,740 B2 | 10/2010 | Shibayama et al. | |
| 8,049,294 B2 | 11/2011 | Bui et al. | |
| 2006/0118877 A1 * | 6/2006 | Tatum et al. | 257/367 |
| 2010/0059869 A1 | 3/2010 | Kaskoun et al. | |
| 2011/0095367 A1 | 4/2011 | Su et al. | |

OTHER PUBLICATIONS

PCT International Search Report and Written Opinion from PCT/US12/60359 mailed on Jan. 18, 2013.

* cited by examiner

*Primary Examiner* — Michael Jung
*Assistant Examiner* — Jay C Chang
(74) *Attorney, Agent, or Firm* — Kenyon & Kenyon LLP (57) ABSTRACT

A semiconductor device formed on a substrate includes a first diode junction formation, a second diode junction formation, and at least one through-silicon-via (TSV), in which a cathode and an anode of the first diode are cross-connected to an anode and cathode of the second diode through the at least one TSV for achieving electrical robustness in through-silicon-via based integrated circuits, including photosensitive devices and circuits for signal processing applications.

17 Claims, 9 Drawing Sheets

ELECTRICAL OVERSTRESS PROTECTION USING THROUGH-SILICON-VIA (TSV)

CROSS-REFERENCE TO RELATED APPLICATIONS

This is a Divisional Application of U.S. Utility application Ser. No. 13/297,571, filed Nov. 16, 2011, which is incorporated in its entirety.

FIELD OF THE INVENTION

The present invention is generally directed to a semiconductor device that includes structures to protect the device from electrical overstress conditions. In particular, the present invention utilizes through-silicon-via (TSV) technology to create electrical overstress protections on the same semiconductor substrate for the semiconductor device.

BACKGROUND IN FORMATION

Semiconductor devices, including PN junctions, typically conduct current in the forward direction and block current in the reverse direction. When operating in the forward direction, the PN junction is capable of conducting high current density (measured in terms of amperes per unit area), while maintaining relatively low power dissipation. However, when a high enough voltage is applied in the reverse direction, the PN junction could eventually reach avalanche breakdown, at which point it is no longer able to block currents in the reverse direction and a relative small current may conduct in the reverse direction. This relative small current in the reverse direction may cause catastrophic failure within the PN junction.

One example of such semiconductor devices is a photodiode, which may include PN junctions (or PIN junctions). In the photoconductive mode, the photodiode is maintained at zero to slightly reverse bias (i.e., the cathode is positive with respect to anode) so that the photocurrent may be proportional to the irradiance on the photodiode. Since a photodiode is essentially a PN junction, its current carrying properties follow that of a PN junction as described in the previous paragraph. Therefore, the photodiode may be a robust device during normal operation under forward bias. However, if a reverse bias as high as the avalanche breakdown is applied, the photodiode may be permanently damaged and could operate erroneously.

The electrostatic discharge (ESD) effects commonly known to occur in electrical circuits may cause sudden and unexpected high voltage charges over semiconductor devices in both forward and reverse directions. Thus, commercial semiconductor devices may require certain protection schemes against ESD. Current ESD protection techniques try to operate PN junctions in the forward direction during all possible stress conditions, thereby avoiding any potential breakdown in the reverse direction. However, this approach may not be appropriate for semiconductor devices such as photodiodes situated in a photodiode array. Semiconductor devices such as photodiodes need bi-directional ESD protection.

DETAILED DESCRIPTION OF EXAMPLE EMBODIMENTS

Figure 1A:
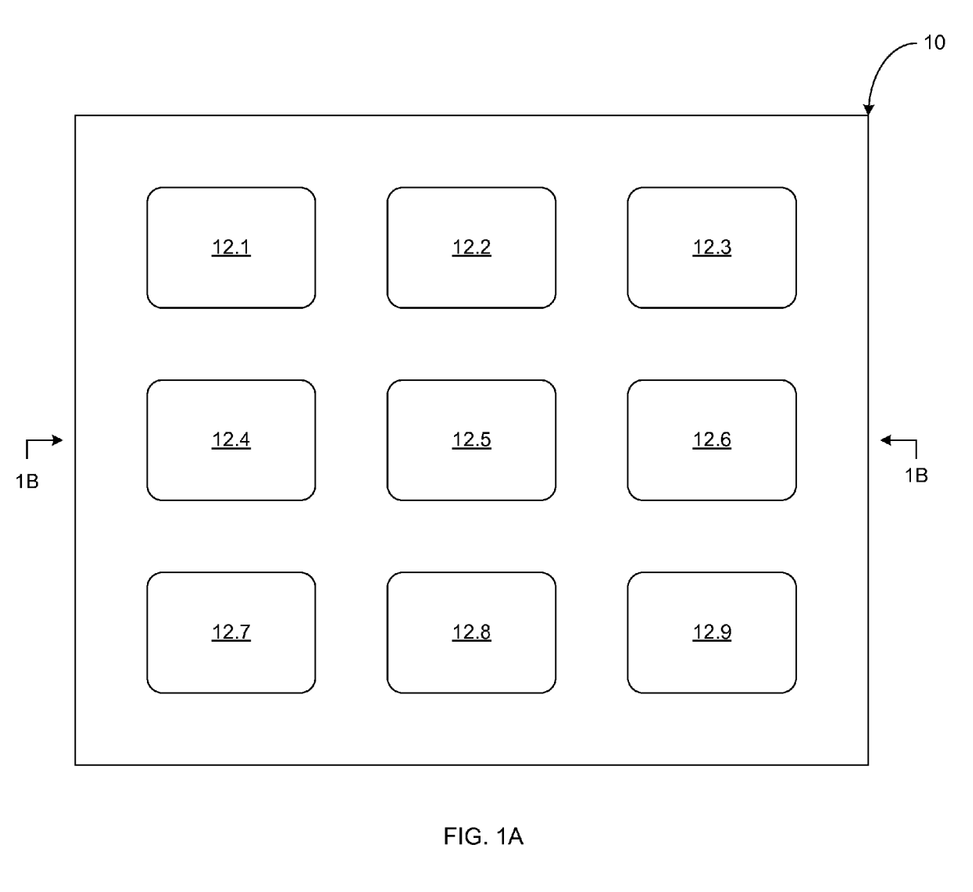
FIGS. 1A-1B are the top and cross sectional views of a photodiode panel that includes an array of photodiodes.
Figure 1B:
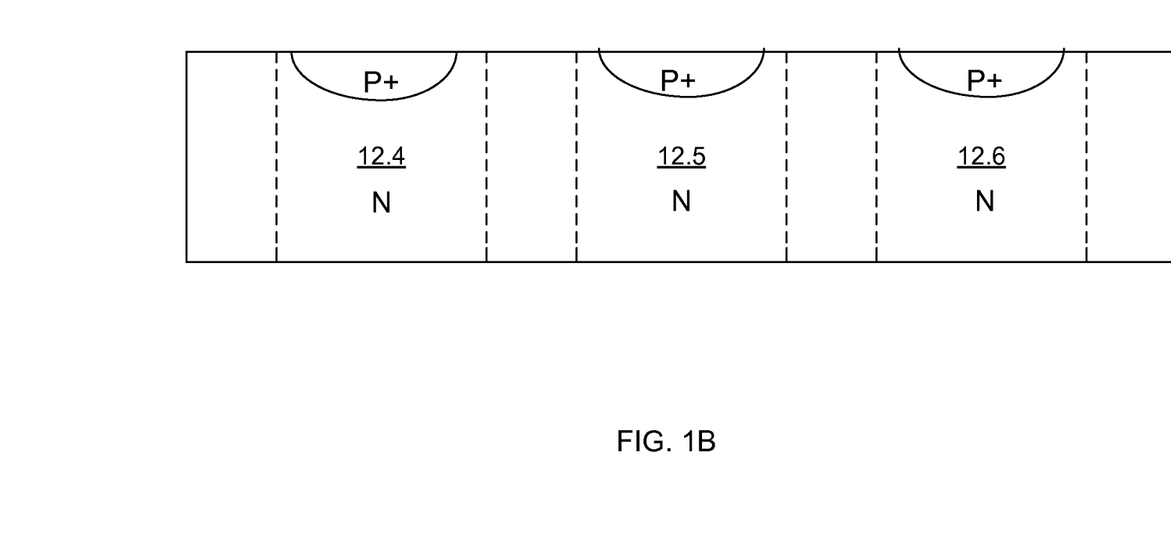

FIG. 1A illustrates a top view of a photodiode panel 10 that includes a plurality of photodiodes 12.1 to 12.9. FIG. 1B illustrates a cross-sectional view of the photodiode panel 10 as shown in FIG. 1A. Referring to FIGS. 1A and 1B, the photodiode panel 10 may include an N-doped semiconductor substrate on a single die, on which selected regions are implanted with P dopants, so that PN junctions for photodiodes 12.1 to 12.9 may be formed in those regions. The N-doped silicon may be connected to cathodes (not shown), and the P-type silicon may be connected to anodes (not shown). During ESD events, electrical discharges may suddenly appear either in the forward direction (anode-cathode) or in the reverse direction (cathode-anode). The photodiodes in the photodiode panel 10 may accommodate forward voltage stress (anode-cathode). However, the reverse voltage stress (cathode-anode), even at relative low stress level, may cause the photodiode panel to fail catastrophically. Because of the physical configuration of the photodiode panel, it is not possible to redirect all of ESD currents to the forward direction through complicated circuits. Instead, bi-directional protections for semiconductor devices against ESD events are desirable for photodiode panels or similar semiconductor devices.

Figure 2:
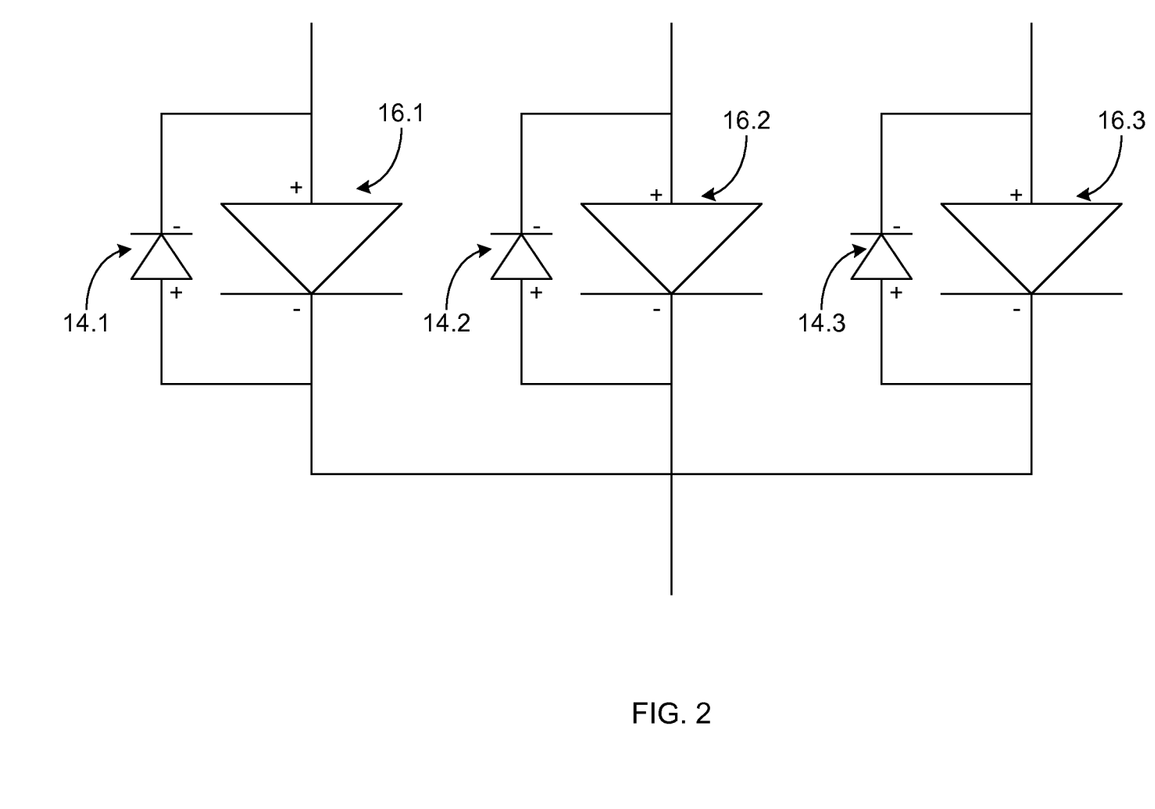
FIG. 2 is a circuit schematic of a bidirectional diode-based protection scheme.

Bi-directional ESD protection may be achieved by using a protective diode which may be reversely coupled to PN junctions of semiconductor devices. FIG. 2 illustrates an exemplary schematic for using protective diodes to protect photodiodes in a photodiode panel. In this example, each PN junction of photodiodes 16.1 to 16.3 may be coupled to a respective protective diode 14.1 to 14.3. The protective diode may be cross-connected to the photodiode so that the cathode (−) of the protective diode may be coupled to the anode (+) of the corresponding photodiode while the anode (+) of the protective diode may be coupled to the cathode (−) of the corresponding photodiode. During normal operation of the photodiodes, zero bias is applied between the cathode and anode of the combined structure, therefore the addition of the protective diodes 14.1-14.3 does not impact the standard functionality of the photodiode 16.1-16.3. However, when an ESD event occurs in the forward direction (anode-cathode) over PN junctions of the photodiodes 16.1 to 16.3, the PN junctions of the photodiodes may discharge the ESD event. On the other hand, when an ESD event occurs in the reverse direction (cathode-anode) over PN junctions of the photodiodes 16.1 to 16.3, the protective diodes 14.1 to 14.3, whose PN junctions are in the reverse connection of PN junctions of the photodiodes, may discharge the reverse ESD event so that the photodiodes may be protected from catastrophic damages. The size of protective diodes may be large or small compared to the size of the photodiode, depending on a tradeoff between robustness and area efficiency.

Embodiments of the present invention may incorporate a protective diode on the same semiconductor substrates in which a PN junction of a semiconductor device is formed. In the context of photodiode panel in which photodiodes may be arranged in arrays on a common semiconductor substrate, protective diodes may also be formed on the same semiconductor substrate. Thus, embodiments of the present invention may have the advantages of ease to fabricating protective diodes since they may be fabricated using the same process steps for fabricating the photodiodes. Further, embodiments of the present invention may have the advantage of compact implementation since protective diodes may be situated inside or in the peripheral regions between the photodiodes on the photodiode panel. Thus, embodiments of the present invention may not significantly increase the overall size of the photodiode panel.

Embodiments of the present invention may use through-silicon-via (TSV) technology to connect photodiodes and their respective protective diode on the same silicon die. TSVs are vertical electrical connections that pass through a silicon die or wafer that may be used to achieve three-dimensional silicon packaging. According to embodiments of the present invention, TSVs may take on different geometric shapes such as loop trenches, in particular such as annular trenches. Embodiments of present invention use TSVs to achieve electrical isolation between the protective diode regions from photodiode regions. Further, embodiments of the present invention use TSVs to achieve anode to cathode (or cathode to anode) connections from one side of the silicon die to the other side of the silicon die. TSVs for the protective diodes may be formed during the same processes to form other TSVs for photodiodes so that no additional process steps may be needed.

Embodiments of the present invention may include a semiconductor structure formed on a single semiconductor substrate. The semiconductor structure may include a first diode, a second diode, and at least one through-silicon-via (TSV), in which a cathode and an anode of the first diode are cross-connected to an anode and cathode of the second diode through the at least one TSV.

Embodiments of the present invention may include a semiconductor structure formed on a single semiconductor substrate. The semiconductor structure may include a first PN junction, a second PN junction, and at least one through-silicon-via (TSV), in which a cathode and an anode of the first PN junction are cross-connected to an anode and cathode of the second PN junction through the at least one TSV.

Embodiments of the present invention may include a semiconductor device that may include a semiconductor substrate and at least one through-silicon-vias (TSV). The semiconductor substrate may include a photodiode and a protective diode, in which a cathode and an anode of the photodiode are cross-connected to an anode and cathode of the protective diode through the at least one TSV.

While the following exemplary embodiments are discussed in the context of protecting photodiodes on a photodiode panel, a person of ordinary skill in the art may readily recognize that the same invention is not limited to the specific example of protecting photodiode, and the invention is applicable to other types of semiconductor devices that include PN junctions which need protection against reverse breakdown during a transient overvoltage stress condition, such as an ESD events.

Figure 3A:
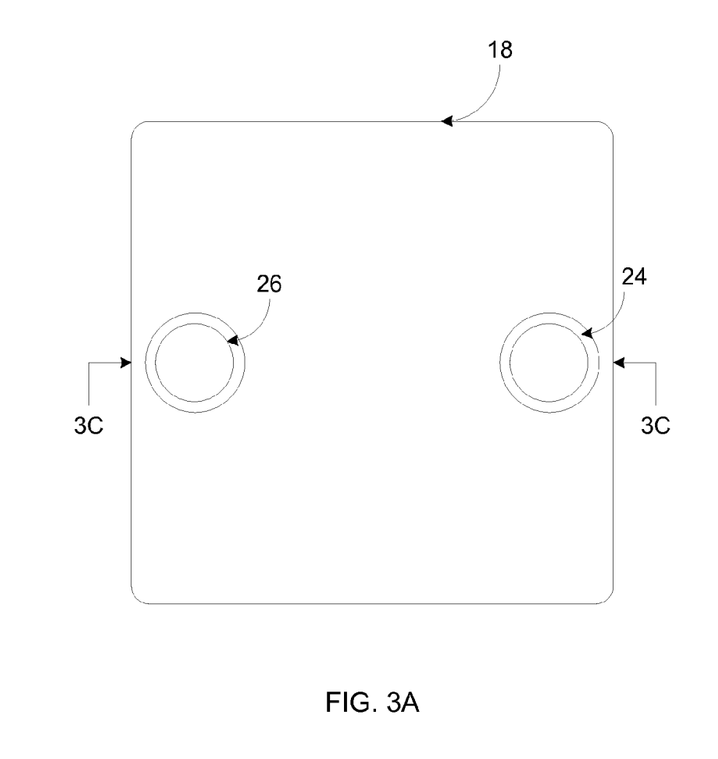
FIGS. 3A-3C are the top, bottom and cross-sectional views, respectively, of a semiconductor device including a photodiode and a protective diode according to an exemplary embodiment of the present invention.
Figure 3B:
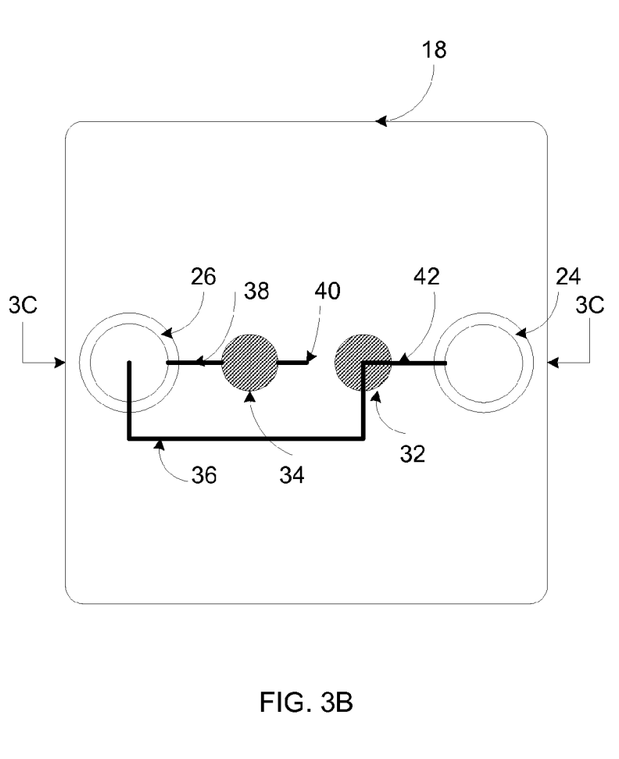
Figure 3C:
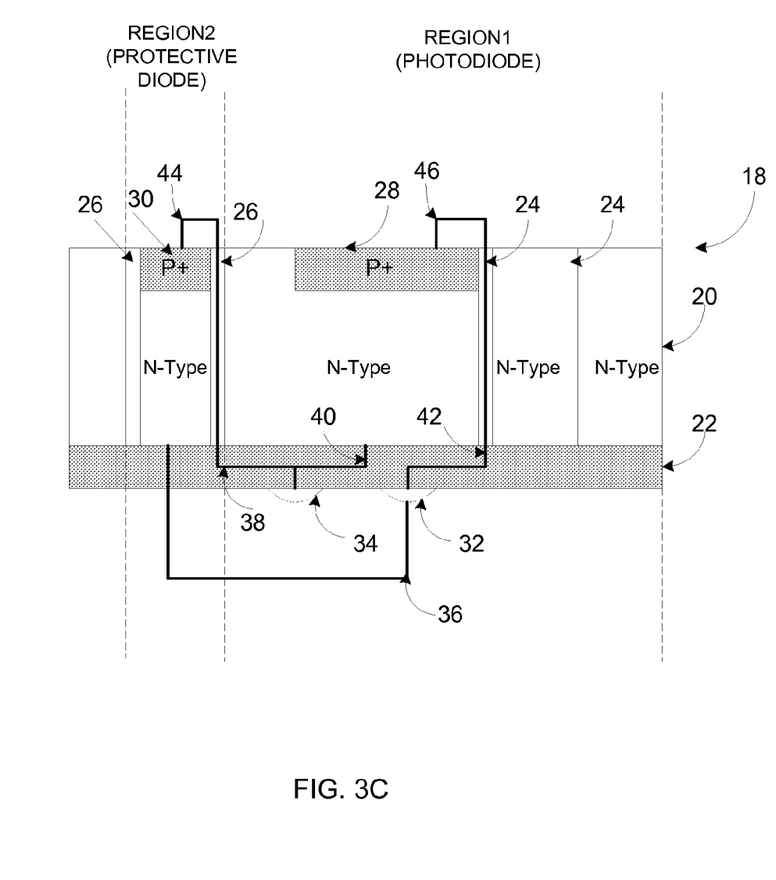

FIGS. 3A-3C illustrate a semiconductor device including a photodiode and an associated protective diode formed on a semiconductor substrate according to an exemplary embodiment of the present invention, in which FIG. 3A is a top view, FIG. 3B is a bottom view, and FIG. 3C is a cross-sectional view of the semiconductor device at the level indicated in FIG. 3A, and FIG. 3B. The semiconductor device 18 may include an insulation layer 22. In one embodiment, the isolation layer 22 may be made from SiO2 or a suitable insulating material. Further, the semiconductor device may include a layer of N-type silicon 20 substrate. Within the layer of the N-type silicon 20 substrate, the semiconductor device 18 may be divided into a first region (REGION1) and a second region (REGION2) that are located close to each other. In an alternatively embodiment, the second region (REGION2) may also be placed inside the first region (REGION1) and decoupled from each other via isolation.

The first region may be implanted with a P-type silicon 28 within the top portion of the N-type silicon 20 to form a first PN junction of the photodiode. The first region may also include a first TSV 24 which may be in the shape of a loop trench. In a preferred embodiment, the loop may be in the form of a ring. The first TSV 24 may completely cut through the N-type silicon 20 from the top surface to the bottom surface to provide a conduit between the two sides. The walls of the first TSV 24 may be coated with an oxidation layer. Conductors such as metal or N+ polysilicon may be deposited within the TSV 24 between the oxidized walls to fill the loop trench so as to provide a conductive connection between the bottom and the top side of the N-type silicon 20. The second region which is next to the first region may include a second TSV 26 which may be constructed similar to TSV 24, including a loop trench having walls coated with an oxidation layer and conductors filled within the loop trench. Further, a P-type silicon area 30 may be implanted in the N-type silicon island that is surrounded by the loop trench of the second TSV 26 to form a second PN junction for the protective diode. In this exemplary embodiment, the second PN junction of the protective diode occupies smaller area than the first PN junction of the photodiode. Moreover, the TSV 26 may electrically isolate the second PN junction from the first PN junction due to the oxidation layer on the walls of TSV 26. In this way, a semiconductor device including the photodiode and protective diode may be compactly formed on a common substrate.

The semiconductor device 18 may further include a first electrical contact 32 and a second electrical contact 34 for connections to the anodes and cathodes of the photodiode in the first region and the protective diode in the second region. In one exemplary embodiment, the first and second electrical contacts 32, 34 may be solder bumps formed on the bottom surface of the semiconductor device 18 (or the bottom surface of the insulation layer 22) and made from conducting materials such as metals or alloys.

The semiconductor device 18 may further include conductor wires 36, 38, 40, 42, 44, 46 made from a metal such as aluminum to connect the anodes and cathodes of the photodiode and the protective diode to the first and second electrical contacts 32, 34. In one exemplary embodiment, a conductor wire 36 may connect the cathode (or the N region of the PN junction) of the protective diode to the electrical contact 32. Similarly, conductor wire embedded in the substrate 22 may connect the cathode (or the N region of the PN junction) of the photodiode to electrical contact 34. Further, a conductor wire 44 may connect the anode (or the P region of the PN junction)

of the protective diode to the conducting material within TSV 26 at a first end from the top surface of semiconductor substrate 20, and a conductor wire 38 may connect electrical contact 34 to the conducting material within TSV 26 at a second end from the bottom surface of semiconductor substrate 20, so that a conducting path may be formed from the anode of the protective diode to the electrical contact 34. Similarly, a conducting wire 46 may connect the anode (or the P region of the PN junction) of the photodiode to the conducting material within TSV 24 at a first end from the top surface of semiconductor substrate 20, and a conductor wire 42 connect electrical contact 32 to the conducting material within TSV 24 at a second end from the bottom surface of semiconductor substrate 20, so that a conducting path may be formed from the anode of the photo diode to the electrical contact 32. In this way, the first electrical contact 32 may be connected to both the anode of the photodiode and the cathode of the protective diode, and the second electrical contact 34 may be connected to both the cathode of the photodiode and the anode of the protective diode.

While conductor wire 36 is illustrated partially outside the insulation layer 22 for the clarity of illustration, the wire 36 may be fully embedded within the insulation layer 22 without interference with other wires. Similarly, wires 38, 40, 42 may also be within the insulation layer 22. A passivation layer (not shown) may be grown on top of the semiconductor substrate 20 so that conducting wires 44, 46 may be within trenches embedded in the passivation layer.

During normal operation, when there are no ESD events and the photodiode operates based on a measurement of the current between the first node 32 to the second node 34, the protective diode is under zero bias from its anode to cathode and is therefore in an OFF state which does not affect the normal operation of the photodiode. During a forward ESD event where a sudden and significant amount of charge exerted from the top surface to the bottom surface of the semiconductor substrate 20, the PN junction of the photodiode in the first region may adequately accommodate the ESD charge during charge dissipation, without causing damages to the PN junction of the photodiode or affecting the PN junction of the protective diode. However, during a reverse ESD event where a sudden and significant amount of charge exerted from the bottom surface to the top surface of the semiconductor substrate 20, while the PN junction of the photodiode is in a reverse bias and incapable of charge dissipation, the PN junction of the protective diode is under a positive bias and may discharge the ESD charge to protect the PN junction of the photodiode from ESD-induced damages.

Embodiments of the present invention as described in FIGS. 3A to 3C may have the advantage of providing ESD protection to photodiodes in a photodiode panel in a very compact and efficient manner since the protective diode may be built within a photodiode or in the peripheral areas between two photodiodes. Thus, the protective diodes do not occupy additional space outside the semiconductor substrate 20. Further, since the protective diodes are formed within TSVs in the semiconductor substrate 20, they can be fabricated using the same process steps as those for fabricating the photodiodes thus in a cost effective manner.

Figure 4:
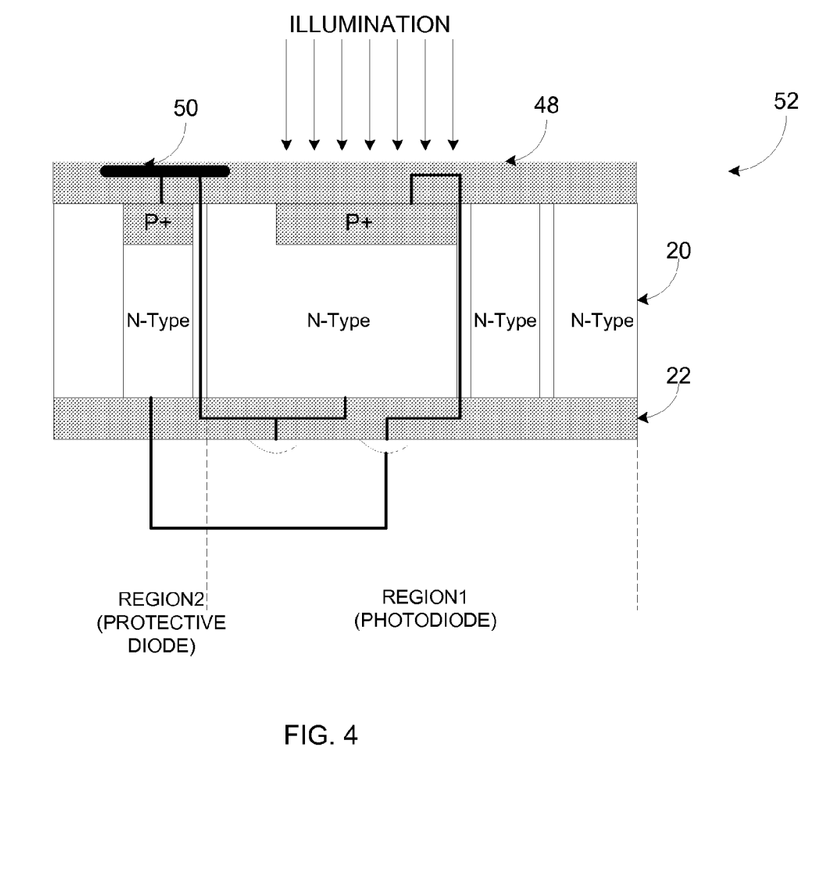
FIG. 4 is a cross-sectional view of a semiconductor device including a photodiode and a protective diode according to another exemplary embodiment of the present invention.

Since the protective diode in the first region as shown in FIGS. 3A to 3C is next to the photodiode in the second region, the light that shines on the photodiode may also shine on the protective diode and generate photocurrent that flows through the protective diode during normal operation. This photocurrent may be detrimental to the normal operation of the photodiode and therefore should be avoided. FIG. 4 illustrates a cross-sectional view of a semiconductor device that includes a metal shield on the protective diode according to an exemplary embodiment of the present invention. The semiconductor device 52 as shown in FIG. 4 may include all of identical elements (with same labels not shown) of the semiconductor device 18 as shown in FIGS. 3A-3C. Further, semiconductor device 52 may include a metal region 50 that may completely shield the protective diode from the light illumination that shines on it. Thus, the light illumination may not generate photocurrent through the protective diode. The metal region 50 may be formed as part of the electrical connection from the cathode of the protective diode to the node 34, or alternatively, as a separate component from the electrical connection. The metal region 50 may be embedded in a passivation layer 48 that may be grown on top of the semiconductor substrate 20. The passivation layer 48 may be made from suitable isolation materials, such as $SiO_2$.

Figure 5:
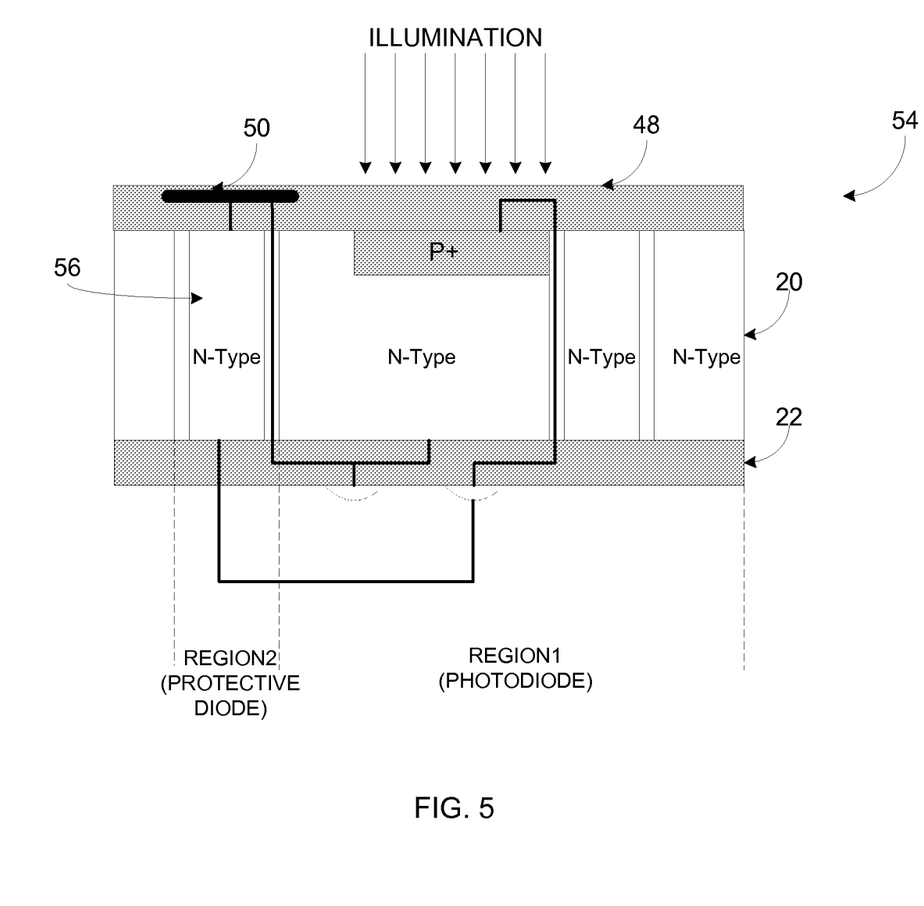
FIG. 5 is a cross-sectional view of a semiconductor device including a photodiode and a metal-semiconductor barrier according to an exemplary embodiment of the present invention.

While the protective diode discussed above is a diode including a PN junction, other types of diode formation may be used to serve as the protective diode. FIG. 5 illustrates a cross-sectional view of a semiconductor device 54 that utilizes a metal-semiconductor barrier diode 56, typically referred to as a Schottky-Barrier diode, as the protective diode. Compared to the protective diode as shown in FIG. 3C and FIG. 4, the Schottky-Barrier 56 diode as shown in FIG. 5 does not include the implanted P-type region 30. Instead, a metal-Si junction may be formed between the metal plate 50 and the N-type silicon 20. Using the Schottky-Barrier diode 56 as the protective diode may have the advantages of faster and lower voltage switching action so that sudden ESD charges may be discharged quickly and a lower voltage drop when conducting which may make the semiconductor device more robust.

While FIGS. 3A to 3C, 4, and 5 illustrate features of the present invention, the present invention may include other aspects. For example, a thin intrinsic semiconductor substrate which has lower N-dopant density than semiconductor substrate 20 may be formed on top of the N-doped semiconductor substrate 20 so that the P-type regions are implanted in the intrinsic layer rather than the N-doped semiconductor substrate 20. In this way, each of the photodiode and protective diode may include a PIN junction rather than a PN junction.

Figure 6:
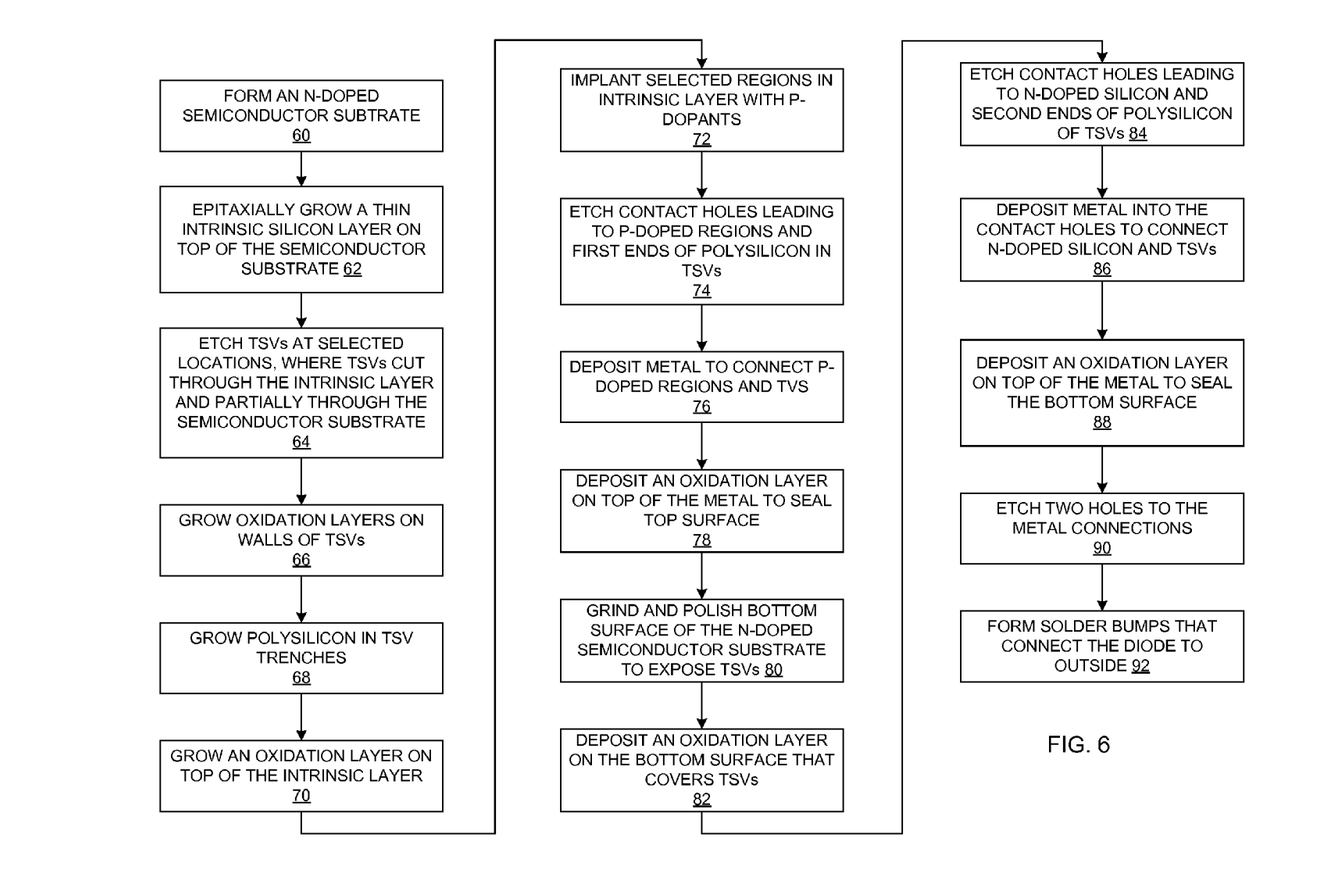
FIG. 6 is a flow diagram of a process for fabricating the semiconductor device as shown in FIGS. 3A-3C according to an exemplary embodiment of the present invention.

FIG. 6 is a flow diagram that illustrates a process to fabricate a semiconductor device including a photodiode and a protective diode according to an exemplary embodiment of the present invention. At 60, an N-doped semiconductor substrate may be formed by a silicon growth process. At 62, an optional intrinsic semiconductor substrate may be epitaxially grown on a top surface of the N-doped semiconductor substrate. The intrinsic semiconductor substrate may include lower density of N dopants than the N-doped semiconductor substrate.

At 64, at least two TSVs at selected locations may be formed by etching loop trenches from a top surface of the intrinsic semiconductor substrate through and further into the N-doped semiconductor substrate. After etching, the loop trenches may have vertical walls, and inside the loop trenches are silicon (N-doped and low density N-doped) islands. At 66, oxidation layers may be grown on these vertical walls of the TSV loop trenches. These oxidation layers may provide electrical isolations between the silicon islands inside these loop trenches and the silicon regions outside these loop trenches. At 68, a conducting material such as N-doped polysilicon may be deposited in the loop trenches to fill up the loop trenches. The conducting material may provide an electrical conducting path from a first surface (top surface) side to a second surface (bottom surface) side while maintaining the electrical isolation between the silicon islands inside loop trenches and silicon regions outside.

At 70, a thin layer of silicon dioxide may be grown on top of the intrinsic semiconductor substrate. At 72, selected regions outside the loop trenches may be identified for a photodiode, and a selected silicon island inside loop trenches may be identified for a protective diode. On the identified silicon region for the photodiode and the identified silicon island for the protective diode, P type donors may be implanted into top portions of the intrinsic semiconductor substrate using a suitable process such as ion implantation. The P-doped silicon regions and the corresponding underlying N-doped silicon regions may form PN junctions for photodiodes and protective diodes.

At 74, contact trenches may be etched in the field oxide layer. A first contact trench may lead from the P-doped region of the identified silicon island to the conducting material in the TSV loop trench surrounding the silicon island. A second contact trench may lead from the P-doped region of the identified silicon region for photodiode to the conducting material of a second TSV loop trench (which is not intended to surround a protective diode). Further, at 76, a metal such as alumina may be deposited into these contact trenches to provide conducting paths from the P-doped regions to the conducting material in TSVs. During this step, a metal plate may also be placed on top of the field oxide layer to cover the P-doped regions of protective diodes. This metal plate may be opaque and shield the P junction of protective diodes from light. At 78, a passivation layer such as silicon dioxide may be deposited on top of the field oxide layer to seal all of the top metal contacts.

The bottom portion of the semiconductor device may be processed as following. At 80, the bottom surface of the N-doped semiconductor substrate may be ground and polished to expose bottom ends of TSV loop trenches. At 82, a bottom oxidation layer may be deposited on the bottom surface to cover the bottom surface of the N-doped semiconductor substrate. At 84, contact trenches may be etched in the bottom oxidation layer. A third contact trench may lead from the conducting material of the first TSV loop trench surrounding the protective diode to N-doped region for the photodiode, and a fourth contact trench may lead from the conducting material of the second TSV loop trench (the one not for protective diode) to the N-doped region for the protective diode. At 86, a metal such as aluminum may be deposited into the third and fourth contact trenches to form connections between the N-doped regions and conducting materials in TSV. Thus, electrical connections may be formed from the P region of the protective diode to the N region of the photodiode, and from the P region of the photodiode to the N region of the protective diode. As such, the anode and cathode of the photodiode may be cross-connected to the cathode and anode of the protective diode.

At 88, a field oxide layer and polyimide layer may be deposited on the bottom surface on the bottom oxide layer to seal off the bottom electrical connections. At 90, two holes may be etched through the field oxide layer to expose the metal contact to N region of the photodiode (and the P region of protective diode) and the metal contact to the N region of the protective diode (and the P region of the photodiode). At 90, solder bump connecting to these metal contacts may be formed through these two holes in the field oxide and polyimide layer. The two metal bumps may serve as the anode and cathode for the photodiode.

While the process as shown in FIG. 6 is directed to a single photodiode and associated protective diode, the same process may be extended to fabricate photodiode panel on which an array of photodiodes and respectively associated protective diodes may be fabricated.

While the present invention has been discussed in terms of an N-type semiconductor substrate 20 that includes localized regions implanted with P-type silicon, embodiments of the present invention may also include a P-type semiconductor substrate that includes localized regions implanted with N-type silicon. In such as exemplary embodiments, all of features of the present invention as discussed above may be equally applicable except for the protective diode is primarily for protecting against a forward ESD charge to the primary diode.

Figure 7A:
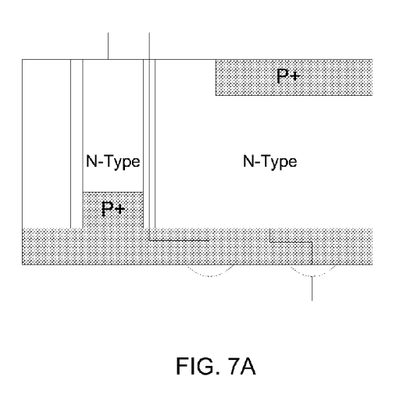
FIGS. 7A and 7B illustrate PN junctions of protective diodes that are in an opposite direction from PN junctions of primary diodes for N-type and P-type semiconductor substrates, respectively, according to exemplary embodiments of the present invention.
Figure 7B:
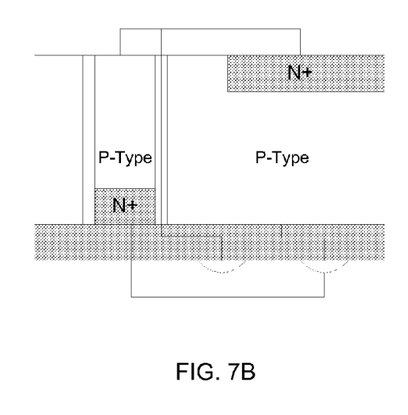

In an alternative embodiment of the present invention, the PN junction of the protective diode may be formed within a TSV in a direction (with respect to a surface of the semiconductor substrate) opposite to a direction (with respect to the same surface of the semiconductor substrate) of the PN junction of the primary diode. Thus, if the primary PN junction is in a direction from a top surface to a bottom surface, the protective PN junction may be in a direction from the bottom surface to the top surface. FIGS. 7A and 7B illustrate such scenarios for N-type and P-type semiconductor substrates, respectively, according to exemplary embodiments of the present invention. As shown in FIGS. 7A and 7B, when the PN junctions of the protective diodes are already in the opposite direction of the PN junction of the primary diode, the need for a second TVS 24 as shown in FIG. 3C may be eliminated. However, an additional processing step may be needed to place the protective junction in the opposite direction.

The TSVs may have different geometric shapes without affecting their functionality. For example, in one exemplary embodiment, horizontal cross-sections of TSVs may be rectangular-shaped trenches rather than ring trenches as described above. In other embodiments, the horizontal cross-section of TSVs may be suitable closed trenches.

In one exemplary embodiment, a photodiode panel may include an array of photodiodes each of which may be associated with at least one protective diode. For example, each photodiode may be associated with one protective diode as discussed above. Alternatively, each photodiode may be associated with two protective diode for more robust protection. In an alternatively exemplary embodiment, two or more photodiodes may share a common protective diode to further reduce silicon area for the photodiode panel.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A semiconductor structure formed on a single semiconductor substrate, comprising:
    a first component including a PN junction;
    a second component including a metal-semiconductor barrier; and
    at least two through-silicon-vias (TSVs),
    wherein a cathode and an anode of the PN junction are cross-connected to an anode and a cathode of the metal-semiconductor barrier through one TSV of the at least two TSVs, wherein the second component is inside one TSV and physically isolated from the first component.

2. The semiconductor structure of claim 1, wherein the metal-semiconductor barrier is a Schottky-metal barrier.

3. The semiconductor structure of claim 1, wherein the second component is formed in a silicon region that is physically isolated from a silicon region of the first component.

4. The semiconductor structure of claim 1, wherein the second component occupies a silicon area that is smaller than a silicon area occupied by the first component.

5. The semiconductor structure of claim 1, wherein
the semiconductor substrate is N-doped,
the first component includes a first P-doped region that forms the PN junction with a first N-doped region of the semiconductor substrate, and
the second component is shielded from light illumination by the metal-semiconductor barrier.

6. The semiconductor structure of claim 1, wherein
the semiconductor substrate is P-doped,
the first diode includes a first N-doped region that forms the PN junction with a first P-doped region of the semiconductor substrate, and
the second component is shielded from light illumination by the metal-semiconductor barrier.

7. The semiconductor structure of claim 1, wherein the at least one TSV includes:
a loop trench, a depth of the loop trench extending from a first side to a second side of the semiconductor substrate, and
a silicon core surrounded by the loop trench,
wherein:
the loop trench is filled with a conducting material from the first to the second sides of the semiconductor substrate,
the second component is formed in the silicon core, and
the anode of the second component is connected to the cathode of the first component through the conducting material.

8. A photo sensing structure, comprising:
a semiconductor substrate including:
a photodiode including a PN junction; and
a protective diode including a metal-semiconductor barrier; and
at least two through-silicon-vias (TSVs),
wherein a cathode and an anode of the photodiode are cross-connected to an anode and a cathode of the protective diode through one TSV of the at least two TSVs,
wherein the protective diode is inside one TSV and physically isolated from the photodiode.

9. The photo sensing structure of claim 8, wherein the metal-semiconductor barrier is a Schottky-metal barrier.

10. The photo sensing structure of claim 8, wherein the protective diode is formed in a silicon region that is physically isolated from a silicon region of the photodiode.

11. The photo sensing structure of claim 8, wherein the protective diode occupies a silicon area that is smaller than a silicon area occupied by the photodiode.

12. The photo sensing structure of claim 8, wherein
the semiconductor substrate is N-doped,
the photodiode includes a first P-doped region that forms the PN junction with a first N-doped region of the semiconductor substrate, and
the protective diode is shielded from light illumination by the metal-semiconductor barrier.

13. The photo sensing structure of claim 8, wherein
the semiconductor substrate is P-doped,
the photodiode includes a first N-doped region that forms the PN junction with a first P-doped region of the semiconductor substrate, and
the protective diode is shielded from light illumination by the metal-semiconductor barrier.

14. The photo sensing structure of claim 8, wherein the at least one TSV includes:
a loop trench, a depth of the loop trench extending from a first side to a second side of the semiconductor substrate, and
a substrate core surrounded by the loop trench,
wherein:
the loop trench is filled with a conducting material from the first to the second sides of the semiconductor substrate,
the protective diode is formed in the substrate core, and
the anode of the protective diode is connected to the cathode of the photodiode through the conducting material.

15. A method, comprising:
forming a semiconductor substrate;
epitaxially growing a silicon layer on top of the semiconductor substrate;
etching at least two through-silicon-vias (TSVs) that cuts through the silicon layer;
implanting donors in a first region to form a first semiconductor component including a PN junction;
depositing a metal-semiconductor barrier to form a second semiconductor component; and
cross-connecting a cathode and an anode of the PN junction to an anode and a cathode of the metal-semiconductor barrier through one TSV of the at least two TSVs,
wherein the second component is inside one TSV and physically isolated from the first component.

16. The method of claim 15, wherein the metal-semiconductor barrier is a Schottky-metal barrier.

17. The method of claim 15, wherein
the semiconductor substrate is N-doped,
the first semiconductor component includes a first P-doped region that forms the PN junction with a first N-doped region of the semiconductor substrate, and
the second semiconductor component is shielded from light illumination by the metal-semiconductor barrier.

* * * * *